United States Patent [19]

Cox, III

[11] 4,444,992
[45] Apr. 24, 1984

[54] PHOTOVOLTAIC-THERMAL COLLECTORS

[75] Inventor: Charles H. Cox, III, Carlisle, Mass.

[73] Assignee: Massachusetts Institute of Technology, Cambridge, Mass.

[21] Appl. No.: 442,338

[22] Filed: Nov. 17, 1982

Related U.S. Application Data

[63] Continuation of Ser. No. 206,326, Nov. 12, 1980, abandoned.

[51] Int. Cl.³ .............................................. H01L 31/04
[52] U.S. Cl. .................................... 136/248; 136/251; 136/256; 136/259
[58] Field of Search ............... 136/248, 246, 251, 256, 136/259

[56] References Cited

U.S. PATENT DOCUMENTS

| | | | |
|---|---|---|---|
| 2,946,945 | 7/1960 | Regnier et al. | 320/2 |
| 3,866,285 | 2/1975 | Clark | 29/157 R |
| 3,888,698 | 6/1975 | Lindmayer et al. | 136/256 |
| 4,002,031 | 1/1977 | Bell | 60/641 |
| 4,056,405 | 11/1977 | Varadi | 136/246 |
| 4,137,123 | 1/1979 | Bailey et al. | 156/647 |
| 4,334,120 | 6/1982 | Yamano et al. | 136/248 |
| 4,339,627 | 7/1982 | Arnould | 136/259 |
| 4,361,717 | 11/1982 | Gilmore et al. | 136/246 |
| 4,413,157 | 11/1983 | Ames | 136/248 |

FOREIGN PATENT DOCUMENTS

| | | | |
|---|---|---|---|
| 1455903 | 11/1976 | United Kingdom | 136/256 |
| 230993 | 11/1968 | U.S.S.R. | 136/256 |

*Primary Examiner*—Aaron Weisstuch
*Attorney, Agent, or Firm*—Arthur A. Smith, Jr.; Paul J. Cook

[57] ABSTRACT

A photovoltaic-thermal solar cell including a semiconductor body having antireflective top and bottom surfaces and coated on each said surface with a patterned electrode covering less than 10% of the surface area. A thermal-absorbing surface is spaced apart from the bottom surface of the semiconductor and a heat-exchange fluid is passed between the bottom surface and the heat-absorbing surface.

10 Claims, 4 Drawing Figures

PHOTOVOLTAIC-THERMAL COLLECTORS

The Government has rights in this invention pursuant to Contract Number DE-AC02-76-ET20279 awarded by the U.S. Department of Energy.

This is a continuation, of application Ser. No. 206,326 filed Nov. 12, 1980, now abandoned.

BACKGROUND OF THE INVENTION

This invention relates to a combined photovoltaic-thermal collector useful for converting sunlight into electrical and thermal energy.

Present solar cells typically comprise a semiconductor material such as silicon or gallium-arsenide which includes a p-n junction near the light-receiving surface of the cell. When light has an energy which exceeds the band gap energy of the semiconductor material, electrons and corresponding holes are established and electrons move through the semiconductor material. A photon transformed into a mobile negative charge carrier leaves behind a mobile hole and the light photon is said to have formed a free electron hole pair. When the holes and electrons are prevented from recombining and electrons are collected such as in a circuit outside of the semiconductor, they produce electrical current in the circuit. Thus, in solar cells, electrodes are attached to the top and bottom surfaces of the semiconductor to collect the electrons and to attach to the external circuit. Typically, in the case of silicon, the wavelengths of light capable of producing photons having an energy exceeding the band gap energy are those shorter than about 1.1 microns in wavelength. Other semiconductor materials have different band gap energies. Light having a wavelength longer than that value have insufficient energy to form electron-hole pairs in the silicon semiconductor material. Thus, solar cells include optical coating on the top surface which increase absorbence of the light energy within the desired wavelength range, thereby maximizing the formation of electron-hole pairs. In addition, optical coatings are commonly used to reflect light of undesirable wavelengths such as that within the infrared range in order to reduce excessive heating of the cell. Also, since only ~10% of absorbed radiation results in electric current, the other 90% is converted to heat. Therefore, it is desirable to re-radiate as much of this heat as possible. This is desirable since increased cell temperatures generally result in a decrease in cell efficiency for producing electricity.

At the present time, there is an incentive to provide in residential and industrial applications solar thermal collectors and solar photovoltaic cells. It would be desirable to provide a solar cell construction suitable for converting light energy into both electrical energy and thermal energy. Furthermore, it would be desirable to provide such a cell construction which requires only a single installation process.

SUMMARY OF THE INVENTION

The present invention provides a solar cell construction suitable for converting light energy into both electrical energy and thermal energy. The solar cell construction comprises a semiconductor body having a p-n junction and having front and back surface metal electrodes formed as spaced-apart metallic lines such as in a grid arrangement. Also, the front and back surface of the semiconductor are made anti-reflective coating. Light having a wavelength whose corresponding energy exceeds the band gap energy of the semiconductor material, such as between about 0.4 and 1.1 microns for silicon, enters the semiconductor and is retained therein. The incident light having energies less than the band gap energy of the semiconductor passes through both coatings and the solar cell into a heat-absorber spaced apart from and located below the back electrode. A heat-exchange fluid is passed into the space between the back electrode and the heat-absorber in order to absorb the thermal energy.

DESCRIPTION OF SPECIFIC EMBODIMENTS

Figure 1:
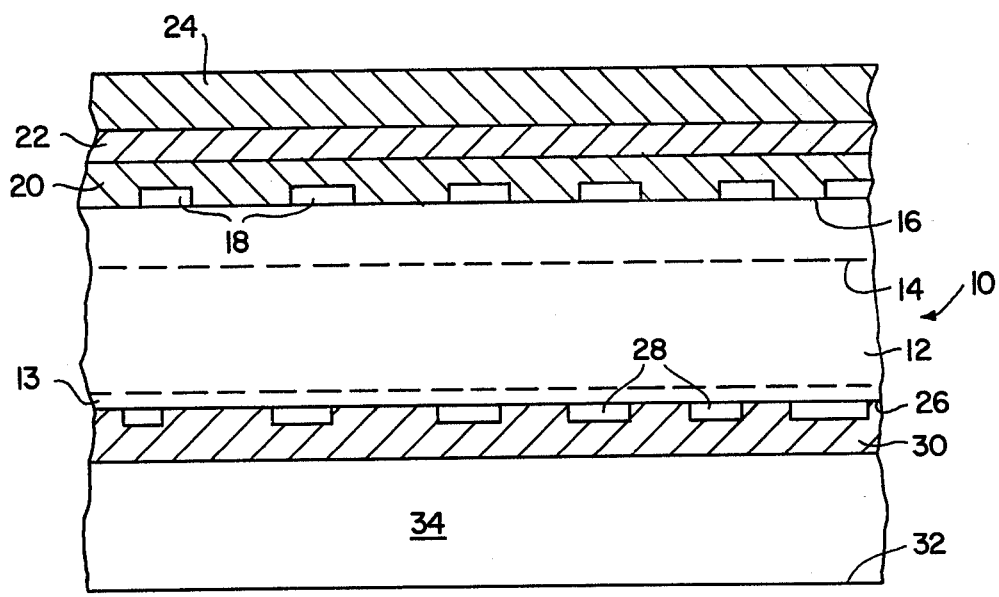
FIG. 1 is a cross-sectional view of one embodiment of this invention utilizing flat surfaces on the semiconductor.

The cell structure of this invention includes a conventional semiconductor layer suitably built to provide a p-n junction in a manner well known in the art. Suitable semiconductor layers include crystalline silicon, gallium arsenide, cadmium sulfide or the like.

The electrodes on the front and back surfaces of the semiconductor layer are formed of metallic strips or grids so that the major portion of the semiconductor back and front surfaces are uncoated by the electrode. Generally, it is desired that the electrode comprise between about 1 and 25%, preferably between about 3 and about 10% of the front semiconductor surface. Generally, it is desired that the electrode comprise between about 1 and 80%, preferably between about 3 and 25% of the back semiconductor surface. By operating in this manner, the amount of light passing through the front surface into the semiconductor layer is maximized while the amount of infrared radiation passing out of the back surface of the semiconductor also is maximized. Generally, the strips or grids have a width of about 0.020 inches (secondary) and about 0.100 inches (main) and are spaced apart from each other a distance of about 0.2 inches (secondary) and about 1.25 inches (main). The electrodes can be deposited on the semiconductor layer by any conventional means such as by evaporation, sputtering or the like. Since the metal grid or strips forming the back electrode are spaced apart from each other, electrical resistance is increased in the back electrode. In order to reduce this resistance, it is preferred that the back surface of the semiconductor be built with an n+ or p+ layer, depending upon whether the portion of the semiconductor adjacent the back surface is an n-layer or a p-layer, respectively. Typical doping levels for n+ or p+ layers are about $10^{18}$, $10^{19}$ and above impurity atoms per centimeter. The p+ layer is utilized when the back surface is normally a p-layer and an n+ surface is utilized when the back surface is normally an n-layer. Since it is desired to minimize reflection from the back surface back into the semiconductor thickness, it is preferred that the dopants forming the n+ or the p+ layer be essentially non-reflecting. In the case of an n+ layer in silicon, the preferred dopant is phosphorous. In the case of p+ layers in silicon, the preferred dopant is boron.

It is essential to the present invention that both the back and the front surfaces of the semiconductor be treated in order to reduce the reflective loss at these surfaces. Thus, in accordance with this invention, the back and front semiconductor surfaces can be either coated with an anti-reflective coating or can be etched to form a non-flat surface which is non-reflecting. In the first case, the "anti-reflective" coating on the front surface of the semiconductor can comprise $SiO_2$, SiO, $Al_2O_3$, $TiO_2$ or $Ta_2O_3$ as a single coating or can comprise multiple coatings which include a layer of $TiO_2$ and $SiO_2$ or a layer of $TiO_2$ and $MgF_2$. The back surface is coated with an anti-reflective coating that permits infrared radiation to pass therethrough. Thus, the back coating can comprise $TiO_2$, $Al_2O_3$, $SiO_2$ or the like. At the cell-air interface, it is preferred to use $Al_2O_3$ or $SiO_2$. At the cell-water or encapsulant interface, it is preferred to use $TiO_2$. The coated back surface of the photovoltaic cell is spaced apart from a surface which absorbs infrared radiation and which is in contact with a heat-exchange fluid. The choice of the preferred anti-reflective coating depends upon the type of heat-exchange fluid utilized since each heat-exchange fluid has a characteristic index of refraction. The heat-exchange fluid is positioned between the photovoltaic cell and the heat-absorbing surface. Means are provided for moving the heat-exchange fluid and for collecting it after being heated so as to provide heat to a desired area such as a residential home. Alternatively, the heat-absorbing layer can contact directly the bottom surface of the photovoltaic cell. Heat-exchange fluid then is passed through at least one conduit that directly contacts the bottom surface of the heat-absorbing layer whereby heat is conducted from the heat-absorbing surface into the fluid. In an alternative embodiment, the front and back surfaces of the semiconductor layer are textured identically in order to render the surfaces anti-reflective. Suitable means for texturing these surfaces is disclosed by Arndt et al in "Optical es of the COMSAT Non-Reflective Cell, Proceedings 11th IEEE Photovoltaic Specialists Conference, Phoenix, Ariz., May 6-8, 1975" which is incorporated herein by reference.

Certain planes in a silicon crystal can be cut (etched) at different rates with the use of etchants such as KOH or hydrazine hydrate. The difference in etch rates can be as high as 400:1 between the 100 and 111 planes (Miller indices); see, for example, Sze, S.M., Physics of Semiconductor Devices, JW & Sons, N.Y. 1969. In the Arndt et al process, a 100 oriented Si crystal is etched to expose the 111 planes.

Alternative texturing means include machining, abrasive roughening or the like. The etch process described above renders the surface as comprising regular tetrahedral pyramids formed on the surface as a result of the anisotropic etch. The percentage reflectance with such a surface is dependent upon the incident angle (degrees from normal) of the light. Generally, between an incident angle of 0 and 50°, the percentage reflectance is less than about 10%.

Although the anti-reflective coating and the texturing are aimed at accomplishing the same end, a distinction exists between them for wavelengths that must be transmitted through the photovoltaic cell. The distinction stems from the fact that the choice of an optimum anti-reflective coating at one surface is largely independent of the choice of an optimum coating at the other surface. In the case of texturizing, however, applying this process to one surface requires applying it to the other, in order for light to be transmitted through the cell. The reason is that light which enters the cell via a texturized surface will strike the other, planar, surface at an angle greater than the critical angle. Thus, this light will be totally internally reflected. In order to permit passage of light through a cell with a texturized surface, then, requires the other surface to have an identical texture. This is readily accomplished with the anisotropic technique, since the texture is directly related to the crystal structure and solar cells are made from a single crystal material.

This invention will be described more fully with reference to the accompanying drawings. Referring to FIG. 1, a solar cell construction 10 includes a semiconductor layer 12 having a p-n junction 14 and a bottom $p^+$ or $n^+$ layer 13. The top surface 16 of the semiconductor layer is coated with a grid-shaped electrode 18 which can be formed, for example, with 3 layers, titanium, paladium and silver as is well known in the art. The electrode 18 and top surface 16, in turn, are coated with a 3 layer anti-reflective coating comprising a bottom layer 20 having a refractive index of 1.5, a middle layer 22 having a refractive index of 1.9 and a top layer 24 having a refractive index of 2.25. The bottom surface 26 of the semiconductor layer is coated with a grid-shaped electrode 28 which can be formed from the same metal layers as the top contact. The bottom surface 26 and the electrode 28 are coated with an anti-reflective coating, 30, having a refractive index of 1.9, cell to air, and 2.25, cell to encapsulant or water and which permit transmission of infrared radiation to a heat-absorbing layer 32. Within the space 34 is passed the heat-exchange fluid such as air or water in order to absorb the heat from the infrared radiation transmitted through antireflective coating 30.

Figure 2:
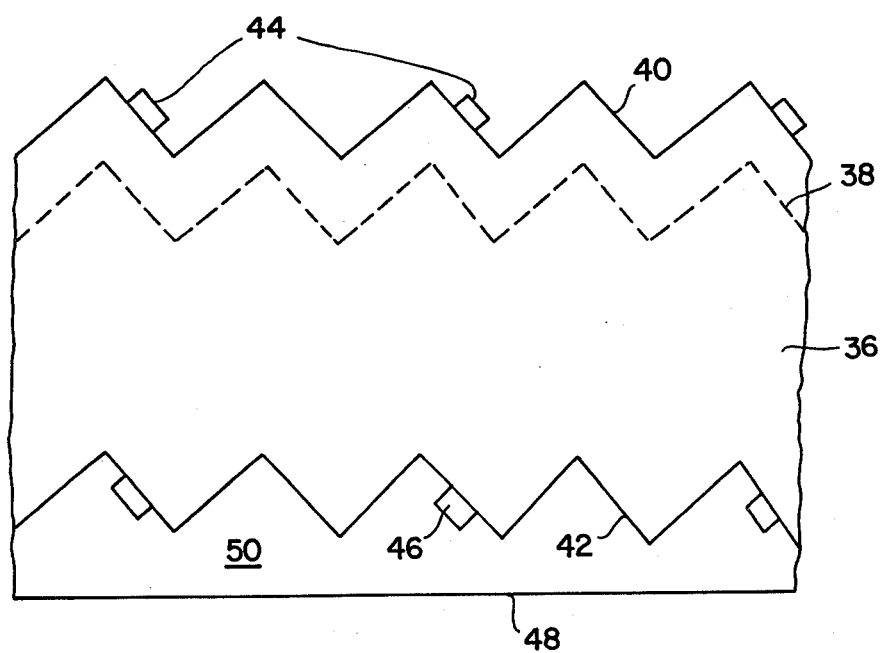
FIG. 2 is a cross-sectional view of an alternative cell of this invention utilizing roughened anti-reflective surfaces.

Referring to FIG. 2, the semiconductor layer 36 includes a p-n junction 38 which is formed after the surfaces pictured in 2 have been texturized. One grid-shaped electrode 44 is coated onto the surface 40 and another grid-shaped electrode 46 is coated onto the surface 42. A heat-absorbing layer 48 is provided directly against the rear surface for liquid or about ⅛ to 1 inch for air. A heat-exchange fluid is passed into space 50 in order to recover heat generated by infrared radiation passing through surface 42.

Figure 3:
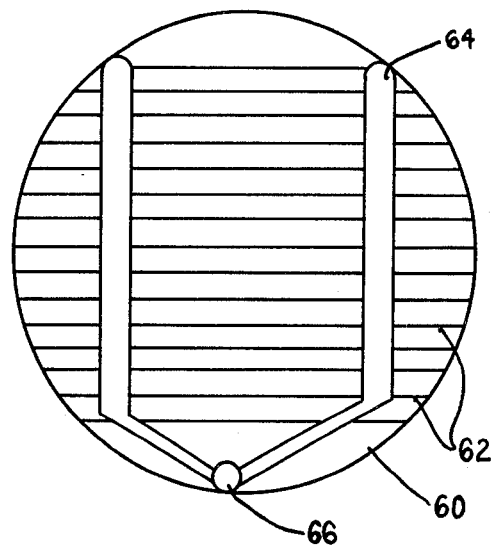
FIG. 3 is a bottom view of a useful pattern for a grid arrangement.

Referring to FIG. 3, a useful grid arrangement for the electrode on the top and/or bottom surfaces 60 of a semiconductor material is shown. The grid arrangement comprises thin strips of a conducting metal 62 arranged in parallel relationship. A pair of relatively thick metal strips 64 electrically contact the thin strips 62 and converge to an electrical contact point 66.

It is not essential for the operation of the solar cell or the photovoltaic/thermal collector that the same grid pattern be used on both surfaces. Manufacturing simplicity will often dictate that the same one is used. It is also not essential that the top and bottom grids have a specific alignment of one relative to the other. However, if the rear grid pattern is the same as the front one and substantially coaligned with it, then the rear grid will contribute negligible additional reflected light above that already contributed by the front grid pattern.

Figure 4:
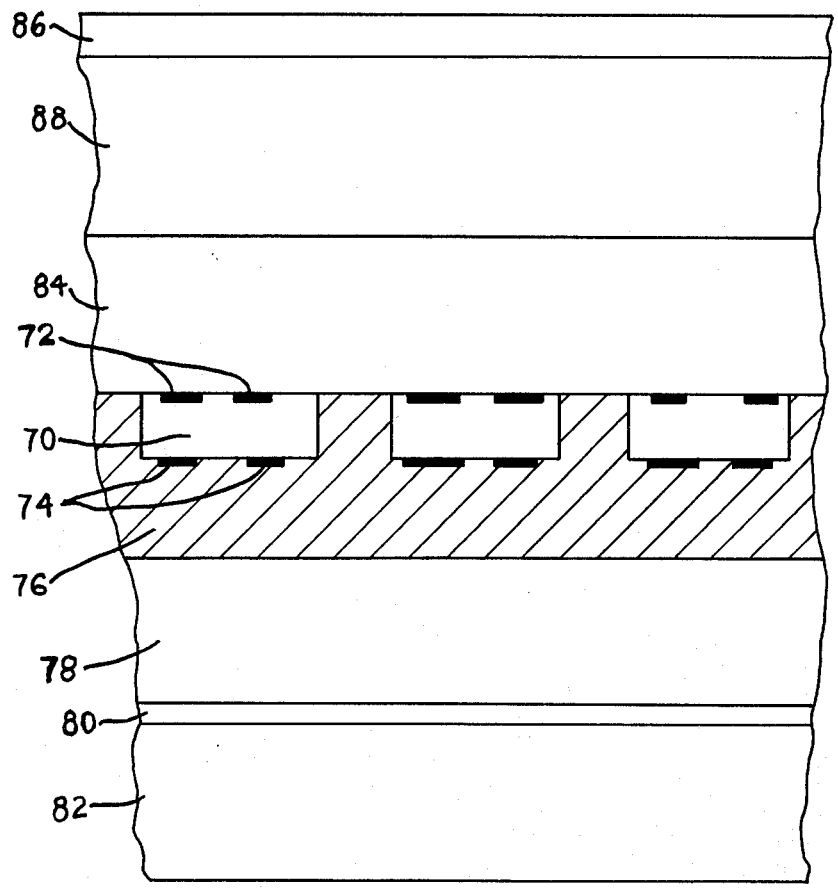
FIG. 4 shows the cell structure of this invention in a solar panel construction.

As shown in FIG. 4, the photovoltaic-thermal collector of this invention can include a plurality of photovoltaic cells 70 which include top electrode 72 and bottom electrode 74. The photovoltaic cells 70 are secured within an encapsulant 76. An open area 78 is provided through which heat-exchange fluids pass. A thermal-absorber layer 80 is located adjacent space 78 and is supported by insulation layer 82. In order to allow light transmittal to the photovoltaic cells and to protect the photovoltaic cells 70 from the weather, glass covers 84 and 86 are provided with an intermediary air space 88. Suitable glass top covers are of the low iron type to promote light transmission up to about 2.5 microns. In addition, the encapsulant should be as free as possible of absorption bands up to about 2.5 microns.

It is to be understood that the cells of the present invention can comprise the working portions of a standard type photovoltaic collector wherein the cells are mounted in an encapsulant as free as possible of absorption bands between 0.4 and 2.5 microns. Suitable encapsulant material comprises a polyester, e.g. Mylar or crosslinked ethylvinyl acetate. In addition, the cells can be protected from outside weather with a covering such as glass or the like. The absorber positioned behind the back surface of the semiconductor can be mounted on a suitable insulating layer in order to minimize heat losses.

I claim:

1. A solar cell construction comprising: a semi-conductor body having a p-n junction, a top surface of said semiconductor body being antireflective, a bottom surface of said semi-conductor body being antireflective, a patterned electrode on each of said surfaces of said semi-conductor body, a heat-absorbing surface adapted to absorb light transmitted through said bottom surface and means for passing a heat-exchange fluid in heat-exchange relationship with said heat-absorbing surface.

2. The solar cell of claim 1 including a p+ or n+ layer in said semiconductor body adjacent said bottom surface.

3. The solar cell construction of any one of claims 1 or 2 wherein said top surface and said bottom surface are textured.

4. The solar cell construction of claim 3 wherein said textured surface is formed by anisotropic etching.

5. The solar cell construction of any one of claims 1 or 2 wherein said anti-reflective surfaces are formed by applying a coating to said semiconductor surfaces.

6. The solar cell construction of any one of claims 1 or 2 wherein said electrodes comprise metal strips which are connected electrically.

7. The solar cell construction of claim 1 wherein the top surface layer is optimized to transmit the solar spectrum between about 0.4 microns and about 2.5 microns.

8. The solar cell construction of claim 1 wherein said semiconductor body is silicon and said bottom surface has a coating which is optimized to transmit the solar cell spectrum between the wavelength corresponding to the band gap of the semiconductor and about 2.5 microns.

9. The solar cell of any one of claims 1 or 2 wherein said electrodes are superimposed with each other.

10. A solar cell assembly which comprises a plurality of the semiconductor bodies of any one of claims 1 or 2 in spaced apart relationship, each having said antireflective surfaces and said patterned electrodes, said semiconductor bodies being housed within an encapsulant material, a heat absorbing surface adapted to absorb light transmitted through the bottom surfaces of said semiconductor bodies and through said encapsulant and means for passing a heat-exchange fluid in heat-exchange relationship with said heat absorbing surface.

* * * * *